United States Patent
Nowak et al.

(10) Patent No.: US 9,972,550 B2
(45) Date of Patent: May 15, 2018

(54) SOURCE/DRAIN EPITAXIAL ELECTRICAL MONITOR

(71) Applicant: GLOBALFOUNDRIES Inc., George Town (KY)

(72) Inventors: Edward J. Nowak, Essex Junction, VT (US); Robert R. Robison, Colchester, VT (US); Lyndon R. Logan, Poughkeepsie, NY (US)

(73) Assignee: GLOBALFOUNDRIES INC., George Town (KY)

( * ) Notice: Subject to any disclaimer, the term of this patent is extended or adjusted under 35 U.S.C. 154(b) by 238 days.

(21) Appl. No.: 14/873,677

(22) Filed: Oct. 2, 2015

(65) Prior Publication Data
US 2017/0098585 A1   Apr. 6, 2017

(51) Int. Cl.
| | | |
|---|---|---|
| *H01L 31/062* | (2012.01) | |
| *H01L 29/66* | (2006.01) | |
| *G06F 17/50* | (2006.01) | |
| *H01L 21/66* | (2006.01) | |
| *H01L 27/088* | (2006.01) | |
| *G01B 7/00* | (2006.01) | |

(52) U.S. Cl.
CPC ............ *H01L 22/34* (2013.01); *G01B 7/00* (2013.01); *H01L 22/32* (2013.01); *H01L 27/0886* (2013.01)

(58) Field of Classification Search
CPC ..... H01L 22/34; H01L 22/32; H01L 27/0886; G01B 7/00
USPC ................. 257/292, 341; 716/126
See application file for complete search history.

(56) References Cited

U.S. PATENT DOCUMENTS

| | | | |
|---|---|---|---|
| 8,689,166 B2 * | 4/2014 | Lu ...................... | G06F 17/5036 716/104 |
| 8,796,093 B1 * | 8/2014 | Cheng ............... | H01L 29/66545 257/327 |
| 2004/0099885 A1 * | 5/2004 | Yeo ......................... | H01L 27/11 257/208 |

* cited by examiner

*Primary Examiner* — Farhana Hoque
(74) *Attorney, Agent, or Firm* — Michael LeStrange; Andrew M. Calderon; Roberts Mlotkowski Safran Cole & Calderon, P.C.

(57) ABSTRACT

A source/drain epitaxial electrical monitor and methods of characterizing epitaxial growth through capacitance measurements are provided. The structure includes a plurality of fin structures; one or more gate structures, perpendicular to and intersecting the plurality of fin structures. The structure further includes a first connection by a first contact at one fin-end of every other fin structure of the plurality of fin structures, and a second connection by a second contact at one end of an alternate fin structure of the plurality of fin structures.

18 Claims, 4 Drawing Sheets

SOURCE/DRAIN EPITAXIAL ELECTRICAL MONITOR

FIELD OF THE INVENTION

The disclosure relates to semiconductor structures and, more particularly, to a source/drain epitaxial electrical monitor and methods of characterizing epitaxial growth through capacitance measurements.

BACKGROUND

FinFET source/drain regions are made by growing epitaxial material on portions of fin structures, extending beyond the gate structures. The size of these epitaxial regions is critical for optimization of yield and performance. At present, physical analysis is required to track the nature of this growth for feedback to process control. This physical analysis includes destructive testing.

By way of example, it is known that growing epitaxial material on fin structures is much more difficult than in planar applications. For example, planar fabrication processes include filling a defined cavity. In these fabrication processes, overfill is the main concern which is very controllable. Also, there is a relatively defined relationship between planar SIMS pad and nominal device fill height which can be used as a monitor. Fin geometry shape, on the other hand, is very poorly related to SIMS pad monitor and the relationship varies strongly with Ge % and B %, fin pitch, etc. The only dependable way to characterize the process variations, e.g., epitaxial size, is through a cross section of the structure using destructive testing.

SUMMARY

In an aspect of the disclosure, a structure includes: a plurality of fin structures; one or more gate structures, perpendicular to and intersecting the plurality of fin structures; a first connection by a first contact at one fin-end of every other fin structure of the plurality of fin structures; and a second connection by a second contact at one end of an alternate fin structure of the plurality of fin structures.

In an aspect of the disclosure, a structure includes: a plurality of fin structures; one or more gate structures extending over the plurality of fin structures, each of the one or more gate structures comprising source and drain regions of epitaxially grown semiconductor material extending on the fin structures; a first contact which electrically connects to alternating at least one of the source and drain regions; a second contact which electrically connects at least one of the source and drain regions which alternate with the alternating at least one of the source and drain regions; and a third connection electrically connecting to the one or more gate structures.

In an aspect of the disclosure, a method includes: measuring capacitance between adjacent interdigitated source and drain regions comprising epitaxially grown semiconductor material with gate structures in different states; combining the measurements between each of the interdigitated source and drain regions which were measured; and correlating the combined measurement with an epitaxial size of the epitaxially grown semiconductor material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The disclosure relates to semiconductor structures and, more particularly, to a source/drain epitaxial electrical monitor and methods of characterizing epitaxial growth through capacitance measurements. More specifically, the present disclosure is directed to interdigitated source/drain regions with arrangements that can measure capacitance between every other wiring line. By implementing the arrangements, it becomes possible to determine epitaxial growth size based on the electrical characterizations, e.g. capacitance. Advantageously, by implementing the arrangements of the present disclosure, an indicator of epitaxial (epi) size can be obtained without destructive testing.

More specifically, the structures described herein include a plurality of "N" parallel fins at product pitch and a plurality of "M" parallel gates at product pitch, perpendicular to and intersecting the "N" parallel fins. A connection is provided at one fin-end of the odd fins to one another, and a connection at the opposing fin-end of the even fins to one another, with a connection to the one or more multiplicity of gates. In additional embodiments, the structures comprise at least: (i) one instance with N1 fins and M1 gates; (ii) one instance with N2 (≥N1) fins and M1 gates; and (iii) instance with N1 fins and M2 (>M1) gates. The invention further includes a method of measuring capacitance of each of structures with gates on and gates off, and combining the measurements to arrive at an epi characteristic as described herein.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures of the present disclosure are built on wafers and are realized in films of material patterned by photolithographic processes on the top of a wafer. In particular, the fabrication of the structures of the present disclosure uses three basic building blocks: (i) deposition of thin films of material on a substrate, (ii) applying a patterned mask on top of the films by photolithographic imaging, and (iii) etching the films selectively to the mask.

Figure 1:
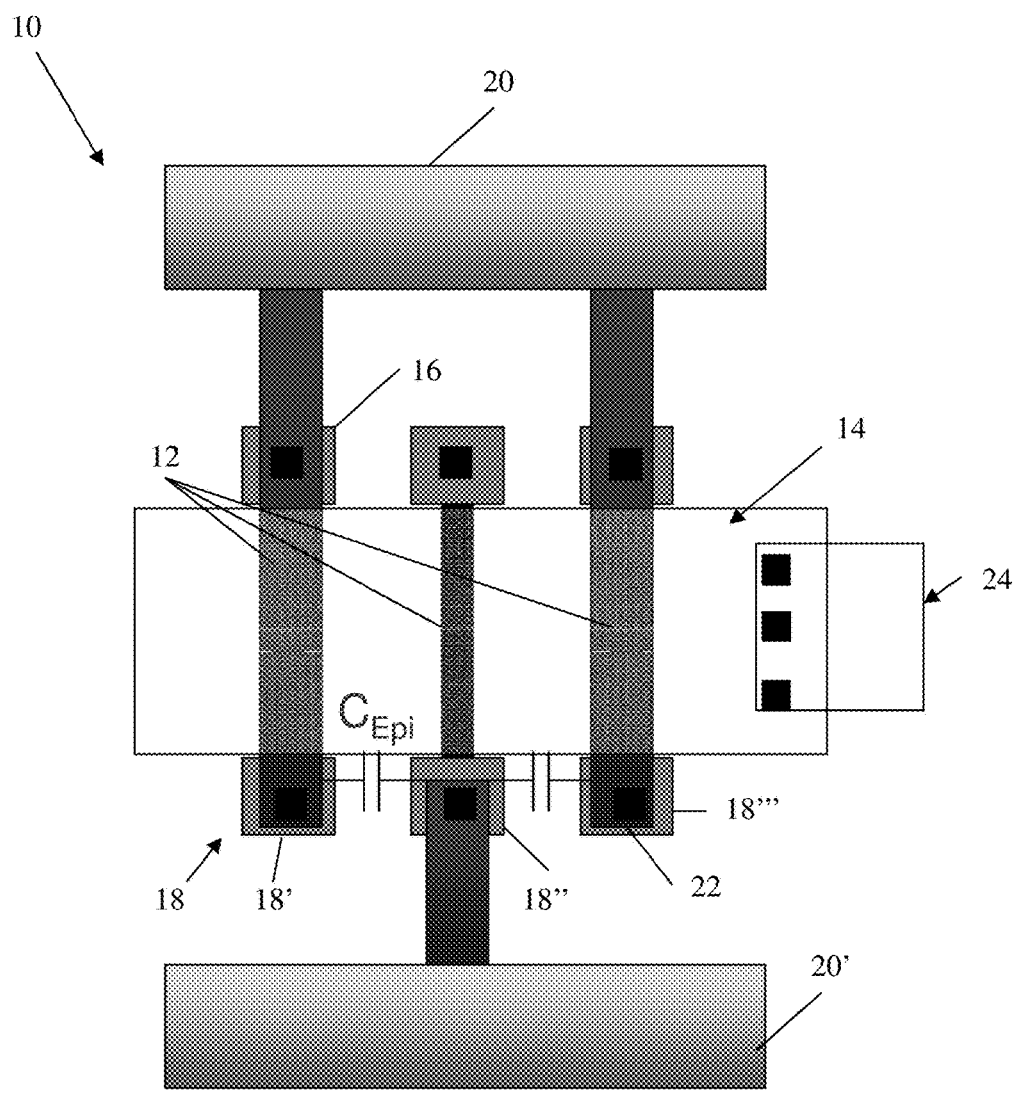
FIG. 1 shows a top view of an exemplary structure and respective fabrication processes in accordance with aspects of the present disclosure.

FIG. 1 shows a top view of a structure in accordance with aspects of the present disclosure. In particular, the structure 10 is a unit cell having interdigitated source/drain regions. Moreover, as in each of the aspects of the invention, the structure 10 can be provided in the kerf of a semiconductor wafer. In this way, the structure can be a kerf monitor for monitoring (measuring) the capacitance between adjacent epitaxial source and/or drain regions.

More specifically, the structure 10 includes a plurality of fins 12, which are parallel to one another. In embodiments, the fins 12 can be any number of fins, e.g., 10 fins, each of which can be composed of any suitable semiconductor material including, but not limited to, Si, SiGe, SiGeC, SiC, GE alloys, GaAs, InAs, InP, etc. In embodiments, the fins 12 can be formed using conventional sidewall imaging techniques known to those of skill in the art such that further explanation is not required herein for a complete understanding of the invention.

A gate structure 14 extends over the fins 12. In embodiments, the gate structure 14 has a fixed gate length ($L_{gate}$) and can be any type of gate structure 14 which preferably is perpendicular to and intersects the fins 12. By way of example, in any of the aspects of the invention, the fixed gate length ($L_{gate}$) can be 24 nm; although this is not critical to the understanding and practice of the present disclosure. Also, in embodiments, the gate structure 14 can be representative of any number of gate structures as described further herein. As in any of the aspects of the invention, the gate structure 14 includes gate contacts 24, which are used to provide a voltage to the gate.

The gate structure 14 includes source regions 16 and drain regions 18, formed on the fins 12, e.g., at ends of the fins 12. In embodiments, the source regions 16 and drain regions 18 are epitaxial grown semiconductor material, e.g., silicon, which is doped or ion implanted accordingly to form source and drain regions.

In embodiments, the source regions 16 and drain regions 18 can undergo a silicide process to form contacts 22. As should be understood by those of skill in the art, the silicide process begins with deposition of a thin transition metal layer, e.g., nickel, cobalt or titanium, over fully formed and patterned semiconductor devices (e.g., doped or ion implanted source and drain regions 16, 18). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 22 in the active regions of the device.

Ground contacts 20 and 20' are electrically connected to the contacts 22 on the drain regions 18 (ends of the fins 12). More specifically, the ground contact 20 is connected to every other drain region, e.g., drain regions 18' and 18'''; whereas, the ground contact 20' is connect to drain region 18'' between the drain regions 18' and 18'''.

In the above arrangement, a capacitance can be measured between the epitaxial grown semiconductor material of the source regions, e.g., silicon, which, in turn, can be correlated to an epi size of the source regions 16 and drain regions 18. For example, one of skill in the art would appreciate that there is a relationship between capacitance and epi size of the source regions 16 and drain regions 18. This relationship can be determined by empirical testing, e.g., by destructive testing measuring epi size of the source and drain regions, and correlating this data to measured capacitances. Moreover, Technology Computer-Aided Design (TCAD) results show that a detectable delta in capacitance is primarily sensitive to epi size. For example, as epi size increases, the capacitance will increase. Accordingly, by measuring the capacitance in a cell it is possible to determine the epi size of the source and drain regions, and particularly identify that the source and drain regions are not merged.

More specifically, by turning the gate off, e.g., the voltage of the gate, e.g., Vgate=0, and applying a small detectable AC signal, e.g., 0.510 fF, to the ground contact 20', a capacitance, e.g., $C_{epi}$, can be measured between the contacts on drain regions 18' and 18'' and drain regions 18'' and 18'''. In any of the aspects of the invention, the number of fins can be increased until there is a detectable signal. The capacitance, e.g., $C_{epi}$, for each adjacent drain region can then be added to determine a total capacitance of the cell ($C_{cell}$). In the example of FIG. 1, the total capacitance of the cell is $C_{cell}=2C_{epi}$. The capacitance can then be correlated to an epi size of the source regions 16 and drain regions 18.

One of skill in the art would understand that measuring the capacitance in different conditions will increase confidence in the value. By way of example, capacitance in the off state, $C_{off}$, is $2(C_{epi}+C_{parasitic})$; whereas, capacitance in the on state, $C_{on}$, for the source side is $2C_{epi}$ and for the drain side is $2(C_{epi}+C_{parasitic})$. Thus, by measuring capacitance for both the on state and the off state, e.g., $C_{on}-C_{off}$, capacitance of the cell $C_{epi}$ can be determined to a greater confidence than a measurement in only the off state, for example.

Figure 2:
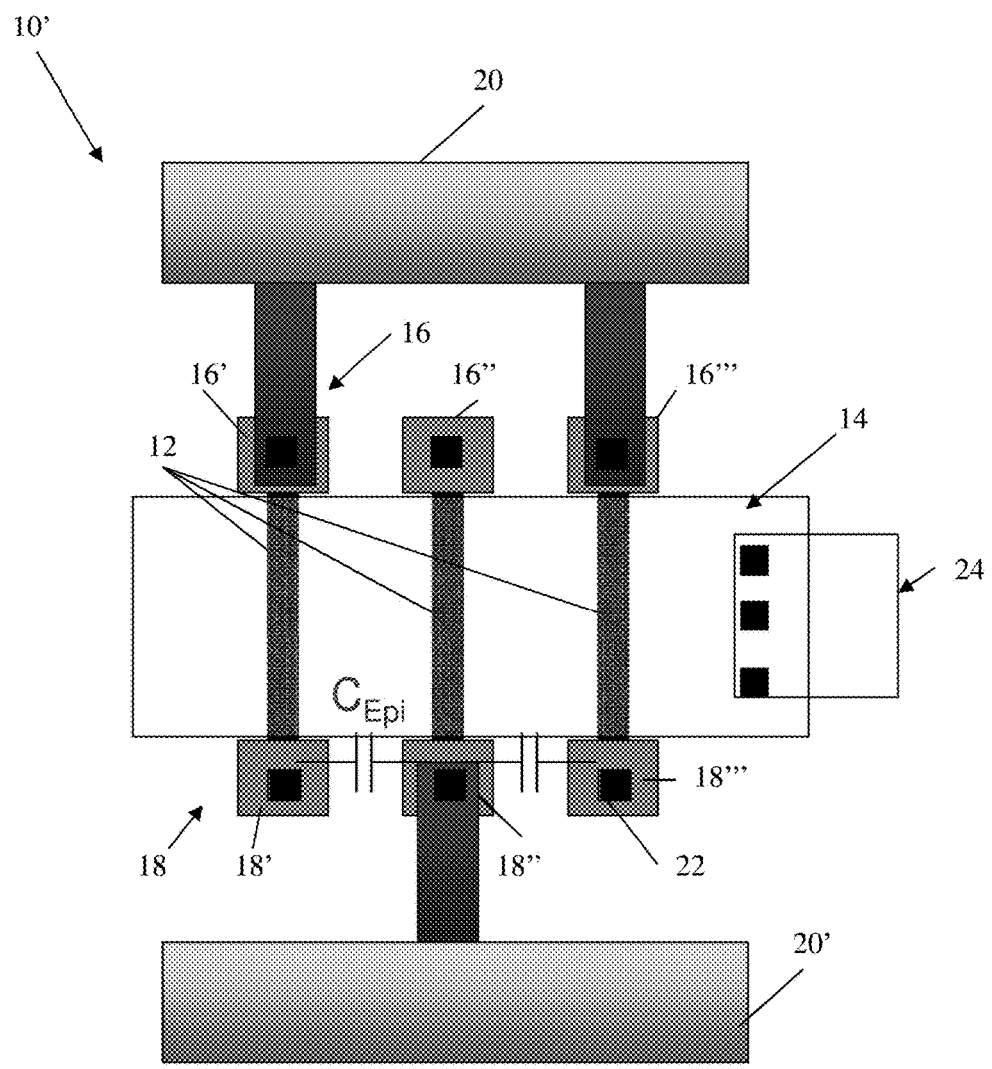
FIG. 2 shows a top view of an alternate exemplary structure and respective fabrication processes in accordance with aspects of the present disclosure.

FIG. 2 shows a top view of an alternative structure in accordance with aspects of the present disclosure. Similar to FIG. 1, the structure 10' is a unit cell having interdigitated source/drain regions. More specifically, the structure 10' includes a plurality of fins 12, which are parallel to one another. In embodiments, the fins 12 can be composed of any suitable semiconductor material as described herein, and can be formed using conventional sidewall imaging techniques known to those of skill in the art. A gate structure 14 extends over the fins 12, which has a fixed gate length ($L_{gate}$). As in any of the aspects of the invention, the gate structure 14 includes gate contacts 24, which are used to provide a voltage to the gate. The gate structure 14 can be any known gate structure 14 which preferably is perpendicular and intersects the fins 12. The gate structure 14 includes source regions 16 and drain regions 18, formed at ends of the fins 12. In embodiments, the source regions 16 and drain regions 18 are epitaxial grown semiconductor material, e.g., silicon, which is doped or ion implanted accordingly to form source and drain regions.

In embodiments, the source regions 16 and drain regions 18 can undergo a silicide process to form contacts 22. Ground contacts 20 and 20' are electrically connected to the contacts 22 on the source regions 16 and drain regions 18. More specifically, the ground contact 20 is connected to every other source region, e.g., source regions 16' and 16'''; whereas, the ground contact 20' is connect to drain region 18'' (of a different gate) between the drain regions 18' and 18''' (and source regions 16' and 16').

In the above arrangement, a capacitance can be measured between the epitaxial grown semiconductor material of the source and drain regions, e.g., silicon. More specifically, by turning the gate off, e.g., the voltage of the gate, e.g., Vgate=0, and applying a small detectable AC signal, e.g., 0.510 fF, to the ground contact 20', a capacitance, e.g., $C_{epi}$, can be measured between the contacts on drain regions 18' and 18'' and drain regions 18'' and 18'''. The capacitance, e.g., $C_{epi}$, for each adjacent drain region can then be added to determine a total capacitance of the cell ($C_{cell}$). In the example of FIG. 2, the total capacitance of the cell is $C_{cell}=4C_{epi}$. Also, as described above, by measuring the capacitance in a cell it is possible to determine the epi size of the source and drain regions, particularly identifying that the epi size has not merged the source and drain regions. By measuring capacitance for both the on state and the off state, e.g., $C_{on}-C_{off}$, a greater degree of confidence of capacitance $C_{epi}$ can be achieved.

Figure 3:
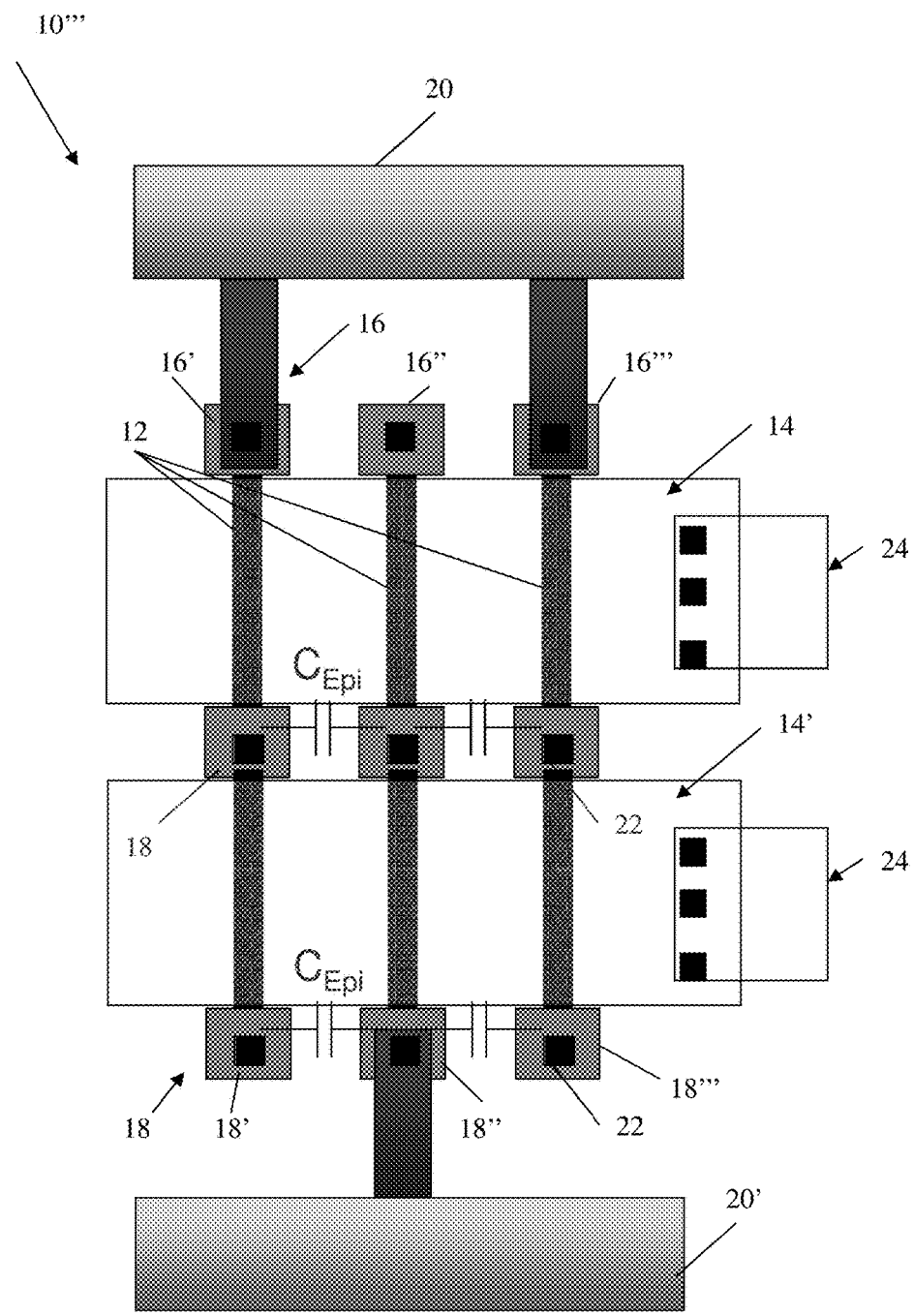
FIG. 3 shows a top view of another exemplary structure and respective fabrication processes in accordance with aspects of the present disclosure.

FIG. 3 shows a top view of a structure in accordance with aspects of the present disclosure. In particular, the structure 10" of FIG. 3 is two unit cells having interdigitated source/drain regions. More specifically, the structure 10" includes a plurality of fins 12, which are parallel to one another. In embodiments, the fins 12 can be composed of any suitable semiconductor material as described herein, and can be formed using conventional sidewall imaging techniques known to those of skill in the art. A plurality of gate structures 14, 14' extend over the fins 12. In embodiments, the gate structures 14, 14' have a fixed gate length ($L_{gate}$) and are perpendicular and intersecting the fins 12. Although two gate structures are shown, it should be understood that any number of gate structures can extend over any number of fins. As in any of the aspects of the invention, the gate structures 14, 14' include gate contacts 24, which are used to provide a voltage to the gate.

The gate structures 14, 14' include source regions 16 and drain regions 18. In embodiments, the source regions 16 and drain regions 18 are epitaxial grown semiconductor material, e.g., silicon, which is doped or ion implanted accordingly to form source and drain regions. In embodiments, the source regions 16 and drain regions 18 undergo a silicide process to form contacts 22. Ground contacts 20 and 20' are electrically connected to the contacts 22 on the source regions 16 and drain regions 18. More specifically, the ground contact 20 is connected to every other source region, e.g., source regions 16' and 16''' of the gate structure 14; whereas, the ground contact 20' is connect to drain region 18" between the drain regions 18' and 18''' (and source regions 16' and 16''') of the gate structure 14'.

In the above arrangement, a capacitance can be measured between the epitaxial grown semiconductor material of the source and drain regions, e.g., silicon. More specifically, by turning the gate off, e.g., the voltage of the gate, e.g., Vgate=0, and applying a small detectable AC signal, e.g., 0.510 fF, to the ground contact 20', a capacitance, e.g., $C_{epi}$, can be measured between the contacts on drain regions 18' and 18" and drain regions 18" and 18'''. The capacitance, e.g., $C_{epi}$, for each adjacent drain region can then be added to determine a total capacitance of the cell ($C_{cell}$). In the example of FIG. 3, the total capacitance of each cell is $C_{cell}=4C_{epi}$. And, as described above, the epi size of the source and drain regions can be determined by the measured capacitance in the cell, particularly identifying whether source and drain regions have merged. Also, by measuring capacitance for both the on state and the off state, e.g., $C_{on}-C_{off}$, a greater confidence level of capacitance $C_{epi}$ can be achieved.

As should be understood by those of skill in the art, capacitance values (Cepi) may include parasitic capacitance. In embodiments, the methods described herein can solve for the extra parasitic capacitance. For example, it is possible to extract out the parasitic capacitance by the following equation:

Ccontact=(Cn−C2)/(n−2),

Where:

"Ccontact" can be noted as Cepi minus the epi capacitance,

"n" is the number of epi regions counting top to bottom (with two being a minimum, one source and one drain), "Cn" is the value of Cepi when the number of epi regions is n, and "C2" represents the value of Cepi when only a source and drain exist.

Figure 4:
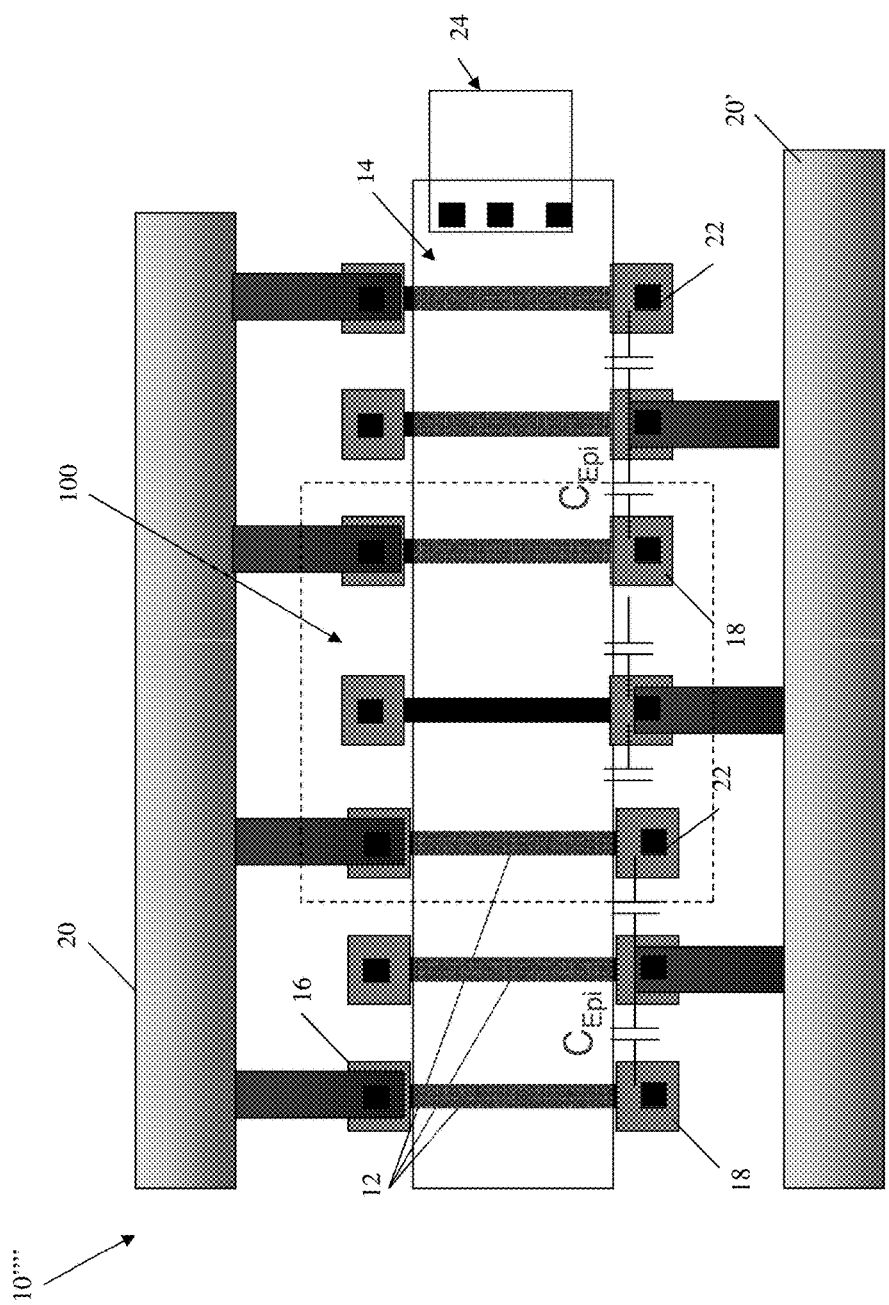
FIG. 4 shows a top view of yet another exemplary structure and respective fabrication processes in accordance with aspects of the present disclosure.

FIG. 4 shows a top view of a structure in accordance with aspects of the present disclosure. In particular, FIG. 4 shows a unit cell 100 which can be multiplied to form the structure 10'''. The structure 10''' includes a plurality of fins 12, which are parallel to one another. In embodiments, the fins 12 can be composed of any suitable semiconductor material as described herein, and can be formed using conventional sidewall imaging techniques known to those of skill in the art. A gate structure 14 extends over the fins 12.

In embodiments, the gate structure 14 has a fixed gate length ($L_{gate}$) and can be any known gate structure which preferably is perpendicular and intersecting the fins 12. As in any of the aspects of the invention, the gate structure 14 includes gate contacts 24, which are used to provide a voltage to the gate. The gate contacts 24 can be silicide regions as already described herein. Although one gate structure is shown, it should be understood that any number of gates can extend over any number of fins.

Still referring to FIG. 4, the gate structure 14 includes source regions 16 and drain regions 18, formed at ends of the fins 12. In embodiments, the source regions 16 and drain regions 18 are epitaxial grown semiconductor material, e.g., silicon, which is doped or ion implanted accordingly to form source and drain regions. The source regions 16 and drain regions 18 can undergo a silicide process to form contacts 22.

Ground contacts 20 and 20' are electrically connected to the contacts 22 on the source regions 16 and drain regions 18. More specifically, the ground contact 20 is connected to every other source region; whereas, the ground contact 20' is connect to every other drain region between the source regions. In this arrangement, a capacitance can be measured between the epitaxial grown semiconductor material of the source and drain regions for each cell, e.g., silicon as described above. In the example of FIG. 4, the total capacitance of each cell is $C_{cell}=4C_{epi}$. The total capacitance of the entire device is then $N*C_{cell}$, where "N" represents the number of cells in the device.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a plurality of fin structures;
   one or more gate structures, perpendicular to and intersecting the plurality of fin structures;
   a first connection by a first contact at one fin-end of every other fin structure of the plurality of fin structures, the first contact skipping over and making no contact to the one fin-end of an alternate fin structure located between the every other fin structure; and
   a second connection by a second contact at one end of the alternate fin structure of the plurality of fin structures,
   wherein the first contact is connected to drain regions of different gate structures and the second contact is connected to a drain region of a gate structure between the different gate structures, adjacent thereto.

2. The structure of claim 1, further comprising a third connection to the one or more gate structures.

3. The structure of claim 1, wherein the one or more gate structures are a plurality of parallel gate structures.

4. The structure of claim 1, wherein the drain regions of different gate structures and the drain region of the gate structure between the different gate structures are epitaxially grown semiconductor material.

5. The structure of claim 1, wherein the first contact is connected to source regions of the different gate structures and the second contact is connected to a drain region of a gate structure between the different gate structures.

6. The structure of claim 5, wherein the source regions of the different gate structures and the drain region of the gate structure between the different gate structures are epitaxially grown semiconductor material.

7. The structure of claim 1, wherein the first contact and the second contact are connected to interdigitated source/drain regions composed of epitaxially grown semiconductor material.

8. The structure of claim 1, wherein the plurality of fin structures and the one or more gate structures comprise a single cell.

9. The structure of claim 1, wherein the plurality of fin structures and the one or more gate structures comprise multiple cells.

10. The structure of claim 1, wherein the plurality of fin structures and the one or more gate structures are provided within a kerf of a wafer and are structured as a monitor to measure capacitance of epitaxially grown semiconductor material.

11. A structure comprising:
    a plurality of fin structures;
    one or more gate structures extending over the plurality of fin structures, each of the one or more gate structures comprising source and drain regions of epitaxially grown semiconductor material extending on the fin structures;
    a first contact which electrically connects to alternating at least one of the source and drain regions;
    a second contact which electrically connects at least one of the source and drain regions which alternate with the alternating at least one of the source and drain regions; and a third connection directly and electrically connecting to the one or more gate structures,
    wherein the first contact is connected to drain regions of different gate structures and the second contact is connected to a drain region of a gate structure between the different gate structures.

12. The structure of claim 11, wherein the first contact is connected to source regions of the different gate structures and the second contact is connected to a drain region of a gate structure between the different gate structures.

13. The structure of claim 11, wherein the plurality of fin structures and the one or more gate structures comprise one of a single cell and multiple cells.

14. The structure of claim 11, wherein the first contact skips over and makes no contact to the alternating at least one of the source and drain which alternate with the alternating at least one of the source and drain regions of the plurality of fin structures.

15. The structure of claim 11, wherein the plurality of fin structures and the one or more gate structures are provided within a kerf of a wafer and are structured as a monitor to measure capacitance of the epitaxially grown semiconductor material.

16. The structure of claim 11, wherein the first contact and the second contact are connected interdigitatedly to the source/drain regions.

17. A method comprising:
    measuring capacitance between adjacent interdigitated source and drain regions comprising epitaxially grown semiconductor material with gate structures in different states, the gate structures being perpendicular to and intersecting a plurality of fin structures;
    combining the measurements between each of the interdigitated source and drain regions which were measured; and
    correlating the combined measurement with an epitaxial size of the epitaxially grown semiconductor material;
    connecting a first contact to drain regions of different gate structures; and
    connecting a second contact to a drain region of a gate structure between the different gate structures, adjacent thereto,
    wherein the first contact skips over and makes no contact to one fin-end of an alternate fin structure located between every other fin structure of the plurality of fin structures.

18. The method of claim 17, wherein the different states includes an on state of the gate structures and an off state of the gate structures.

* * * * *